Nov. 5, 1974

ATSUSHI SAIKI ET AL

METHOD OF PRODUCING MULTILAYER WIRING STRUCTURE OF INTEGRATED CIRCUIT

Filed Sept. 25, 1972

3,846,166

1

3,846,166

METHOD OF PRODUCING MULTILAYER WIRING STRUCTURE OF INTEGRATED CIRCUIT

Atsushi Saiki, Tokyo, Takaaki Mori, Ome, Seiki Harada, Hachioji and Kikuji Sato, Kokubunji, Japan, assignors to Hitachi, Ltd., Tokyo, Japan Filed Sept. 25, 1972, Ser. No. 291,570
Claims priority, application Japan, Sept. 25, 1971, 46/74,851
Int. Cl. B44d 1/18
U.S. Cl. 117—212 19 Claims

ABSTRACT OF THE DISCLOSURE

A method of producing a multilayer wiring structure wherein a resin layer is formed on a substrate which is provided with the first wiring conductor layer on its surface, a metal film of a material different from that of the first wiring conductor layer is formed on the resin layer, openings are provided at predetermined positions of the metal film or at positions for the connection between wiring conductor layers, the openings each having a gentle inclination of the side wall portion are formed in the resin layer using the metal film as a mask and by exposure to a plasma discharge atmosphere. The metal film is removed, and the second wiring conductor layer having no level difference of an abrupt angle at connecting parts between the wiring conductor layers is deposited on the resin layer, to thereby form a wiring structure of two layers. If necessary, the above steps are repeated, to thereby form the wiring structure of three or more layers. Also, an air-insulated multilayer wiring structure may be formed, wherein all the resin layers of the above multilayer wiring structure are removed.

Background of the Invention

The present invention relates to a method of producing a multilayer wiring structure of an integrated circuit with at least two wiring layers, the structure having wiring conductor layers which are free from any level difference of an abrupt angle.

Brief Description of the Prior Art

A prior-art method of producing wiring conductor layers in an integrated circuit, particularly a monolithic integrated semiconductor circuit, has been performed as below. On a silicon substrate in which a semiconductor device such as a transistor is formed in contact with its surface, an insulating film of e.g., silicon dioxide is formed by the well-known vapor growth or high-frequency sputtering process. Thereafter, the insulating film at parts required for the connection between the substrate and the wiring conductor to be formed on the insulating film on the substrate is removed by the photoetching process. On the entire area of the substrate thus exposed and the insulating film, a conductor metal such as aluminum is evaporated to form a metal film. Using the photoetching process, unnecessary portions of the metal film are removed. Thus, a desired wiring pattern made of the conductor metal is obtained. If it is intended to further construct one or more conductor layers on the wiring conductor, an insulating film is deposited thereon by the use of the above method. Thereafter, the insulating film at parts required for the connection between the wiring conductor layer already formed and the wiring conductor layer to be formed on the insulating film is removed by the photoetching process. Subsequently, the conductor metal is evaporated over the entire area. A desired wiring pattern is obtained from the evaporated metal film by the photoetching process.

2

Such a prior-art producing method has been disadvantageous as discussed below. On account of a level difference caused by the first layer of wiring conductor or a level difference caused by an opening which is provided in the insulating film at the connecting part between the conductor layers and whose slope at its side wall portion is sharp, the metal of the sceond conductor layer is not deposited to a sufficient thickness on the side surface of such a stepped portion (the portion of the different level), so that the second wiring conductor layer tends to be disconnected in this portion. Moreover, pin holes are prone to appear in the insulating film at such a place at which the first layer of wiring conductor and the second layer of wiring conductor cross so that the two wiring conductor layer opposing with the insulating films held therebetween are easily short-circuited.

Regarding the production porcess which gives rise to the level difference as described above, there has been made an attempt in which an aluminum film is evaporated as the wiring conductor metal film over the entire area, the aluminum at parts other than the required conductor portion being selectively converted into aluminum oxide by the anodic oxidation process, to thereby eliminate the level difference. This attempt, however, has been disadvantageous in that the aluminum oxide film formed by the anodic oxidation process is generally porous and poor in insulating properties, so that the insulation between the conductor layers lacks reliability.

The disadvantages in the foregoing prior-art methods of production quickly become more remarkable in the wiring structure of three or more layers with increase in the number of layers. It is, therefore, very difficult to produce the wiring structure of at least three layers by prior-art methods.

Brief Summary of the Invention

In order to eliminate the disdavantages of the foregoing multilayer wiring structure, the present invention provides a method of producing a multilayer wiring structure in which a resin layer is employed for the insulating layer and openings of the resin layer are formed for the connecting portion between conductor layers by a process quite different from the prior-art, and in which the resin layer is, if necessary, removed for air insulation.

In order to accomplish the above object, according to the present invention, a resin layer is formed as an insulating layer on the entire area of a substrate which is provided with the first wiring conductor layer on its surface, a metal film which is provided with openings at positions for the connection between wiring conductor layers is, thereafter, formed on the resin layer, openings each having a gentle inclination of a side wall portion are formed in the resin layer by such physical etching means in which, using the metal film as a mask, the substrate with the completely cured resin layer is exposed to a plasma discharge atmosphere, or is subjected to irradiation of an ion beam, the second wiring conductor layer of a predetermined pattern is further deposited on the resin layer after removing the metal film, and, if necessary, the above steps are repeated to form the third and further wiring conductor layers, whereby a multilayer wiring structure in which the wiring conductor layers are free from any level difference of an abrupt angle at the connecting portion between the wiring conductor layers is obtained. Furthermore, all the resin layers of the multilayer wiring structure formed by the above method are removed, whereby an air-insulated multilayer wiring structure can be obtained.

In the multilayer wiring structure produced by the method of the present invention, the insulation between the wiring conductor layers is reliable owing to the use of a resin or air for the insulating layer between the wiring conductor layers. In addition, the inclination of the side wall portion of the opening of the resin layer, formed at the connecting portion between the wiring conductor layers, is gentler and more easily controllable than the inclination of the side wall portion of an opening provided in the prior-art silicon dioxide film. Accordingly, even in the case where the metal of the second and further wiring conductor layers is evaporated, the evaporated metal is sufficiently thickly deposited at the inclined part. The disconnection in the side wall portion one of the disadvantages of the prior-art methods is remarkably reduced. The evaporated metal film is very firmly affixed to the side wall portion of the opening of the resin layer provided by the plasma etch or ion beam etch. In contrast, the metal film evaporated on the side wall portion of the opening of the silicon dioxide film by the prior-art method has a weak adhesive force. It has therefore, been disadvantageous in that, at the step of etching the metal film into a predetermined pattern, an etchant often intrudes into the side wall portion to corrode the metal film and to finally disconnect the wiring. Since, in accordance with the production method of the present invention, the evaporated metal film adheres to the side wall portion very securely as described above, the disadvantage in the prior-art method mentioned above is also completely eliminated.

The production of the multilayer wiring structure of three or more layers as has been difficult in the prior art is also facilitated by the adoption of the method of the present invention.

As means to perforate the resin layer, there is also a method in which the resin layer is selectively etched by an etchant. With the method, however, it is required that, after perforating the resin layer under a semi-cured state, the substrate is heated to completely cure the resin layer. Such a method is, accordingly disadvantageous by rendering the process complicated and lowering the dimensional accuracy. In contrast, in the case of employing the treatment in the plasma atmosphere, the openings can be provided in the completely cured resin layer, and, hence, the above-mentioned disadvantage is not caused.

Brief Description of the Drawing

FIGS. 1*a* to 1*c* are sectional views illustrating the steps of producing a multilayer wiring structure according to the present invention, while

Description of the Preferred Embodiments

The method of producing a multilayer wiring structure according to the present invention can be better understood from the following description of the preferred embodiments taken in conjunction with the foregoing figures.

EMBODIMENT 1

Figure 1A:
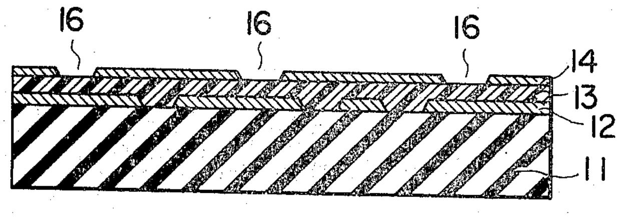

In FIG. 1*a*, using a wiring substrate of ceramics for a hybrid LSI as a substrate 11 and using aluminum as the material of the first wiring conductor layer, the first conductor layer 12 having a predetermined wiring pattern was formed by the well-known photoetching process. Subsequently, formation of a thin polymer resin film 13 as an insulating layer was conducted as below.

A thermohardening or thermosetting polymer resin, for example, an epoxy resin (in the embodiment, Epicoat 1007 which is a product by Shell Petroleum Chemicals Inc.) was dissolved in a solvent (in the embodiment diacetone alcohol), to prepare a resin solution having a resin concentration of 10–40%. The resin solution was applied onto the substrate by the rotational or spinning application method. In the embodiment, the substrate was rotated at 2,000–8,000 r.p.m.

Figure 1B:
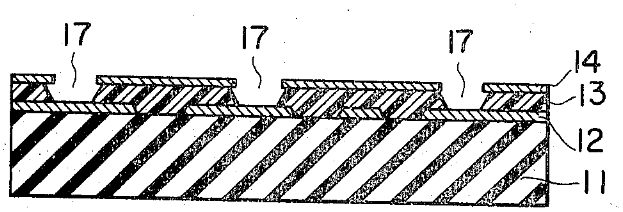

Thereafter, the substrate was heated at about 200° C. for several tens of minutes—several hours, to harden depolymerize the resin and to thereby form a secure resin film. Subsequently, a film 14 of chromium was formed on the resin film 13 by the vacuum evaporation process. Next, using an etchant of, for example, an aqueous solution of cerium nitrate ammonium or an aqueous solution with hydrogen peroxide water added to the first-mentioned aqueous solution, the chromium was selectively removed by the well-known photoetching process, to form windows 16 at connecting portions between the wiring conductor layers. Subsequently, the specimen was exposed to a conventional oxygen plasma discharge technique, for example, as described in R. L. Bersin, Solid State Technology, June 1970, pages 39–45, so that the polymer resin film at parts exposed to the windows 16 was removed through the reaction with the oxygen plasma (under an oxygen gas pressure of about 1 mm. Hg and at a plasma output of about 2 mw., the amount of etching of the epoxy resin film was approximately 0.5 μm. for one minute). Thus, windows 17 shown in FIG. 1*b* were formed in the polymer resin film.

Figure 1C:
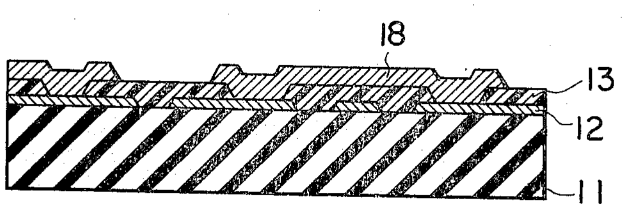

At this time, the resin at parts covered with the chromium film 14 does not react with the oxygen plasma, and is subject to no change. The side wall portion of each window 17 is gently inclined as compared with that of a window provided in the prior-art silicon dioxide film. In addition, the angle of the inclination can be controlled by the oxygen gas pressure, or by the mixing ratio when argon gas is mixed into the oxygen gas. Thereafter, using the aqueous solution of cerium nitrate ammonium or the aqueous solution with hydrogen peroxide water added thereto, the chromium film was completely removed. At this time, not only the polymer resin film, but also the first wiring conductor layer 12 exposed to the windows 17, is stable to the etching solution for the chromium film 14, and is subject to no change. Thereafter, if necessary, the exposed parts of the first wiring conductor layer 12 were cleaned with a solution containing phosphoric acid. Next aluminum was evaporated over the entire area of the substrate. The second wiring conductor layer 18 which was electrically connected with the first wiring conductor layer 12 at the parts of the windows 17 provided at predetermined positions were formed as shown in FIG. 1*c* by the use of the well-known photoetching technique. Since the inclination of the side wall portion of the window 17 is gentle as stated above, the aluminum is deposited to a sufficient thickness even in the side wall portion. Therefore, no disconnection of the conductor occurred at this part.

Figure 2:
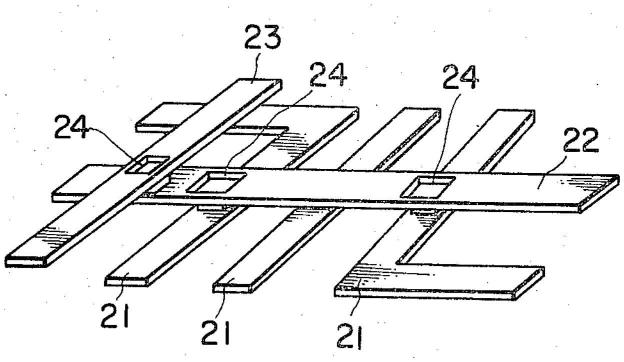
FIG. 2 is a view showing the three-dimensional construction of only a wiring conductor portion at the upper part of the wiring structure obtained by the present invention.

In the embodiment, the above procedure was repeated once more, to provide the third conductor layer and to thus obtain a three-layer wiring structure. In this way, a number of three-layer wiring structures were produced. Some of them were further exposed to the oxygen plasma discharge, to remove all the resin film. Thus, air insulated three-layer wiring structures were also obtained. The three-dimensional construction of a wiring conductor portion at the upper part thereof is shown in FIG. 2. In the figure, reference numeral 21 designates the first wiring conductor layer, 22 the second wiring conductor layer, 23 the third wiring conductor layer, and 24 the connecting portion between the wiring conductor layers.

EMBODIMENT 2

In FIG. 1, a silicon semiconductor substrate in which an element such as a transistor, a diode and a resistor was made was used as the substrate 11. The treatment was conducted in conformity with the steps described in Embodiment 1. As a result, it was made sure that the method of the invention is effective without any hindrance for, not only the wiring of the hybrid LSI, but also the multilayer wiring of monolithic LSI.

EMBODIMENT 3

For the polymer resin film 13 in FIG. 1, in addition to the epoxy resin (not restricted to the above-mentioned Epicoat 1007 of Shell Petroleum Chemicals Inc.) described in Embodiment 1, any resin material having properties for accomplishing the object of the present invention, such as a phenol resin, polyimide resin, polybenzimidazole resin, and a combination of at least two of these resins can be used. The properties are that the particular resin material does not solidify or polymerize and can be adjusted to an appropriate viscosity by a solvent at the normal temperature, that it becomes sufficiently solid or polymerized and stable in several ten minutes-several hours by heat treatment at about 150° C.–300° C., and that the polymerized resin film has a dielectric strength of about $10^4$ V./cm. or more and a thermal resistance in which it is stable at a temperature of at least 150° C. for a long period of time.

In the Embodiment 3, using the phenol resin, a mixed resin material consisting of the epoxy resin and the phenol resin, and the polyimide resin, the steps as in Embodiment 1 were conducted. It was made sure that these resin materials are also very effective for the performance of the present invention.

EMBODIMENT 4

In Embodiment 1, the combination of material between the wiring conductor layer 12 or 18 and the film 14 is used as the mask for selectively removing the resin consisting of aluminum for the wiring conductor and chromium for the film. Needless to say, however, the combination is not restricted to the above example, but any combination of materials satisfying the following conditions may be empolyed for the object of the present invention. The first condition is that an etchant is employed which can etch the film 14 without attacking the wiring conductor layers 12 and 18. The second condition is that, even when the film 14 is subjected to the treatment in the plasma discharge or the irradiation of the ion beam, the thickness and properties of the film itself are not changed at all or are changed only slightly, and the polymer resin film 13 covered with the film 14 can be sufficiently prevented from being etched.

From such a viewpoint, chromium was used for the wiring conductor 12 or 18 and aluminum for the film 14 in the embodiment. As a result, it was made sure that the object of the present invention is satisfactorily accomplished by such a selection of materials. In this case, an etchant for aluminum, for example, an aqueous solution of phosphoric acid or an aqueous solution with nitric acid, acetic acid, etc. added thereto, does not attack chromium at all. However, the combination in Embodiment 1 which employs aluminum lower in resistivity than chromium as the material of the wiring conductor is more excellent than that in the present embodiment which employs chromium for the wiring conductor.

In addition to the above, the material of the wiring conductor may be one of gold, molybdenum, nickel, copper, platinum, titanium, etc., or an alloy comprising at least two of these metals in combination. Further, the wiring conductor may have the construction of a multiple film made of at least two of these metals. The combined composition or construction is more excellent in the mechanical strength than the single use of aluminum and is advantageous particularly for the air-insulated wiring structure.

The method of producing a multilayer wiring structure as described above in detail, can be applied to the manufacture of a monolithic semiconductor device, a hybrid semiconductor device, a semiconductor device containing a MOS element, a semiconductor microcircuit device which requires wiring, a hybrid integrated circuit which is formed on an insulating substrate made of, e.g., alumina, and so forth.

We claim:

1. A method of producing a multilayer wiring structure for an integrated circuit, comprising the steps of:

(a) forming a first wiring conductor layer of a predetermined pattern on the surface of a substrate;

(b) forming a resin layer on the resulting entire exposed area of said substrate and on said wiring conductor layer formed on said substrate;

(c) forming, on said resin layer, a metallic film which is selectively etched to form openings of a predetermined shape at predetermined positions for connection between the wiring conductor layers;

(d) providing openings at predetermined positions in said resin layer using said metallic film as a mask by physically etching said resin layer with a plasma discharge atmosphere, said openings reaching said wiring conductor layer located beneath said resin layer;

(e) removing said metallic film formed by the step (c) with an etchant; and (f) forming a second wiring conductor layer of a predetermined pattern, which is electrically and mechanically connected with the exposed parts of said first wiring conductor layer partially exposed through the step (d) and which extends on said resin layer formed by the step (b).

2. The method according to Claim 1, wherein said substrate is a semiconductor silicon substrate on the surface of which an insulating film perforated at parts for connection between predetermined regions in said substrate and said first wiring conductor layer is deposited.

3. The method according to Claim 1, wherein after completion of the step (f), steps (b), (c), (d), (e), and (f) are repeated at least once.

4. The method according to Claim 1, further comprising the step of removing all the resin layers after completion of step (f).

5. The method according to Claim 1, wherein said resin layer is made of a thermosetting thermohardening resin.

6. The method according to Claim 1, wherein a resin material of said resin layer is composed of at least one resin material selected from the group consisting of an epoxy resin, a phenol resin, a polyimide series resin and a polybenzimidazole resin.

7. The method according to Claim 1, further comprising the step of cleaning the exposed parts of said wiring conductor layer after completion of the step (e) and before the step (f).

8. The method according to Claim 1, wherein the material of said wiring conductor layer is composed of at least one metal selected from the group consisting of gold, aluminum, molybdenum, nickel, copper, platinum and titanium.

9. The method according to Claim 1, wherein the material of said wiring conductor layer is aluminum, while that of said metal film formed at the step (c) is chormium.

10. The method according to Claim 1, wherein step (d) comprises exposing said metallic film and resin to an oxygen atmosphere the characteristics of which are controlled to control the angle of inclination of the side wall portions of the openings formed in said resin layer.

11. The method according to Claim 1, wherein step (b) comprises the steps of:

(i) dissolving a thermosetting thermohardening polymer resin in a solvent to prepare a resin solution;

(ii) applying said resin solution to said substrate and wiring conductor layer; and (iii) heating said substrate at a preselected temperature for a predetermined period of time to securely form said resin film.

12. The method according to claim 11, wherein step (c) comprises depositing said metallic film on said resin and said selective etching of said metallic film at said predetermined positions is performed by photoetching.

13. The method according to Claim 1, wherein step (a) comprises forming a first wiring conductor layer of a predetermined pattern on the surface of a substrate having a semiconductor circuit element formed therein.

14. The method according to Claim 1, wherein said step of selectively etching said metallic film comprises the step of etching said film with an etchant with respect to which said first and second wiring conductor layers are substantially impervious.

15. The method according to Claim 14, wherein said etchant consists of a solution selected from the group consisting of an aqueous solution of cerium nitrate ammonium and an aqueous solution of cerium nitrate ammonium with hydrogen peroxide water added thereto.

16. The method according to Claim 15, wherein said first and second wiring conductor layers are made of aluminum and said metallic film is made of chromium.

17. The method according to Claim 1, wherein said metallic film is made of a material, the thickness and properties of which are not substantially changed by step (d).

18. The method according to claim 1, wherein said openings in said resin layer have inclined side wall portions.

19. The method according to claim 12, wherein said metallic film is deposited by vacuum deposition.

References Cited

UNITED STATES PATENTS

| | | | |
|---|---|---|---|
| 3,705,055 | 12/1972 | Christensen et al. | 117—212 |
| 3,767,490 | 10/1973 | Alberts | 156—2 |
| 3,525,617 | 8/1970 | Bingham | 112—212 |
| 3,558,366 | 1/1971 | Tepselter | 112—212 |
| 3,628,999 | 12/1971 | Schneble, Jr. | 174—68.5 |

OTHER REFERENCES

Chemical Abstracts, Vol. 68, p. 4993, col. 5137k.

JOHN D. WELSH, Primary Examiner

U.S. Cl. X.R.

29—625; 117—217; 156—2; 174—68.5